United States Patent
Dang et al.

(10) Patent No.: US 10,147,694 B2
(45) Date of Patent: Dec. 4, 2018

(54) DIRECT INJECTION MOLDED SOLDER PROCESS FOR FORMING SOLDER BUMPS ON WAFERS

(71) Applicant: GLOBALFOUNDRIES INC., Grand Cayman (KY)

(72) Inventors: Bing Dang, Chappaqua, NY (US);
Michael A. Gaynes, Vestal, NY (US);
Paul A. Lauro, Brewster, NY (US);
Jae-Woong Nah, Closter, NJ (US)

(73) Assignee: GLOBALFOUNDRIES INC., Grand Cayman (KY)

(*) Notice: Subject to any disclaimer, the term of this patent is extended or adjusted under 35 U.S.C. 154(b) by 249 days.

(21) Appl. No.: 14/986,925

(22) Filed: Jan. 4, 2016

(65) Prior Publication Data

US 2016/0118358 A1  Apr. 28, 2016

Related U.S. Application Data

(62) Division of application No. 13/612,812, filed on Sep. 12, 2012, now Pat. No. 9,273,408.

(51) Int. Cl.
*H01L 21/02* (2006.01)
*H01L 23/00* (2006.01)
(Continued)

(52) U.S. Cl.
CPC .............. *H01L 24/11* (2013.01); *C25D 5/022* (2013.01); *H01L 21/02107* (2013.01);
(Continued)

(58) Field of Classification Search
None
See application file for complete search history.

(56) References Cited

U.S. PATENT DOCUMENTS

| | | | |
|---|---|---|---|
| 4,289,841 A * | 9/1981 | Cohen | G03F 7/34 430/253 |
| 5,244,143 A | 9/1993 | Ference et al. | |

(Continued)

FOREIGN PATENT DOCUMENTS

JP   2003305637   10/2003

OTHER PUBLICATIONS

Claudius Feger, Injection Molded Solder Process for Forming Solder Bumps on Substrates, Unpublished U.S. Appl. No. 13/154,412, filed Jun. 6, 2011.

*Primary Examiner* — Stefanie S Wittenberg
(74) *Attorney, Agent, or Firm* — Anthony Canale; Andrew M. Calderon; Roberts Mlotkowski Safran Cole & Calderon, P.C.

(57) ABSTRACT

Solder bumps are provided on round wafers through the use of injection molded solder. Copper pillars or ball limiting metallurgy are formed over I/O pads within the channels of a patterned mask layer. Solder is injected over the pillars or BLM, filling the channels. Molten solder can be injected in cavities formed in round wafers without leakage using a carrier assembly that accommodates wafers that have been previously subjected to mask layer deposition and patterning. One such carrier assembly includes an elastomeric body portion having a round recess, the walls of the recess forming a tight seal with the round wafer. Other carrier assemblies employ adhesives applied around the peripheral edges of the wafers to ensure sealing between the carrier assemblies and wafers.

19 Claims, 8 Drawing Sheets

(51) Int. Cl.
*C25D 5/02* (2006.01)
*C25D 7/12* (2006.01)
*H05K 3/34* (2006.01)

(52) U.S. Cl.
CPC ............ *H01L 24/13* (2013.01); *H01L 24/742* (2013.01); *C25D 7/123* (2013.01); *H01L 24/16* (2013.01); *H01L 24/81* (2013.01); *H01L 2224/11001* (2013.01); *H01L 2224/11002* (2013.01); *H01L 2224/1141* (2013.01); *H01L 2224/1147* (2013.01); *H01L 2224/1162* (2013.01); *H01L 2224/11312* (2013.01); *H01L 2224/11462* (2013.01); *H01L 2224/13111* (2013.01); *H01L 2224/13147* (2013.01); *H01L 2224/13155* (2013.01); *H01L 2224/16225* (2013.01); *H01L 2224/81801* (2013.01); *H01L 2924/014* (2013.01); *H01L 2924/0132* (2013.01); *H01L 2924/01322* (2013.01); *H01L 2924/12042* (2013.01); *H05K 3/3436* (2013.01); *H05K 2201/10734* (2013.01)

(56) References Cited

U.S. PATENT DOCUMENTS

| | | |
|---|---|---|
| 5,395,803 A | 3/1995 | Adams |
| 5,776,551 A * | 7/1998 | Pasch ........................ C23C 8/36 156/281 |
| 5,848,670 A | 12/1998 | Salzman |
| 6,076,723 A | 6/2000 | I-Tsung Pan |
| 6,213,386 B1 | 4/2001 | Inoue et al. |
| 6,832,747 B2 | 12/2004 | Cordes et al. |
| 6,942,265 B1 * | 9/2005 | Boyd ................ H01L 21/67742 294/189 |
| 7,784,673 B2 | 8/2010 | Cordes et al. |
| 2002/0125402 A1 * | 9/2002 | Cordes ................ B23K 3/0623 249/119 |
| 2003/0073036 A1 | 4/2003 | Peng et al. |
| 2003/0173031 A1 * | 9/2003 | Aggarwal ............ C23C 16/4584 156/345.51 |
| 2005/0155709 A1 | 7/2005 | Tzeng et al. |
| 2007/0089836 A1 * | 4/2007 | Metzner ............ H01L 21/67103 156/345.51 |
| 2008/0173237 A1 * | 7/2008 | Collins ............. H01J 37/32412 118/723 I |
| 2010/0194014 A1 | 8/2010 | Huang et al. |
| 2010/0225011 A1 * | 9/2010 | Lee ..................... H01L 21/6836 257/797 |
| 2011/0127312 A1 | 6/2011 | Gruber et al. |

* cited by examiner

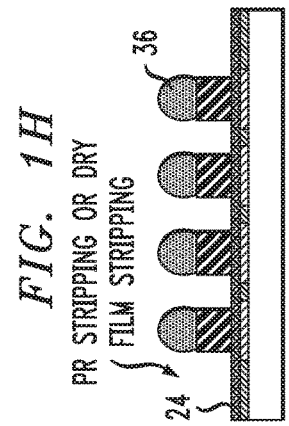
FIG. 1A PASSIVATION LAYER 21
I/O PAD 22  WAFER 20
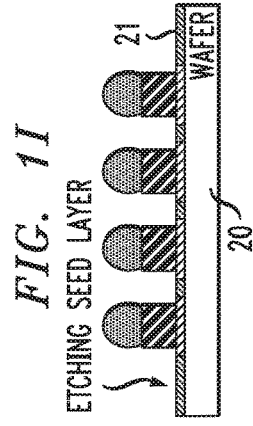
FIG. 1E ELECTROPLATING Cu 30
28
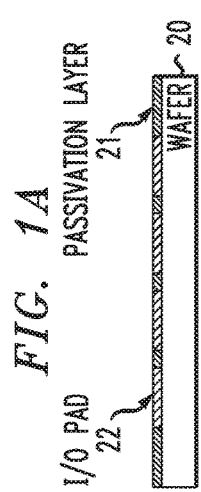
FIG. 1H PR STRIPPING OR DRY FILM STRIPPING
24  36
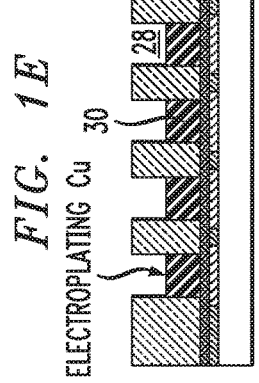
FIG. 1B SEED LAYER DEPOSITION
24
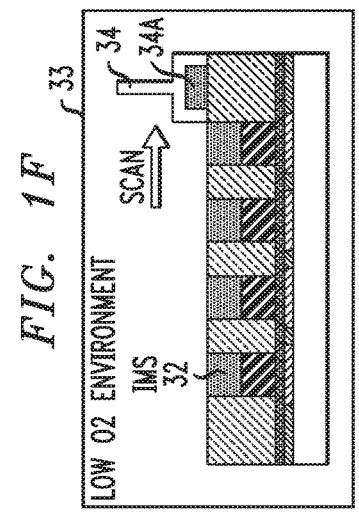
FIG. 1F LOW O2 ENVIRONMENT
IMS 32  SCAN  33  34 34A
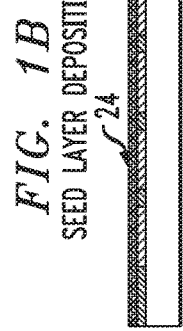
FIG. 1I ETCHING SEED LAYER
21  WAFER  20
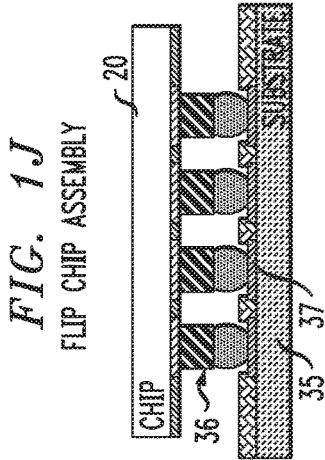
FIG. 1C PR COATING OR DRY FILM LAMINATION 26
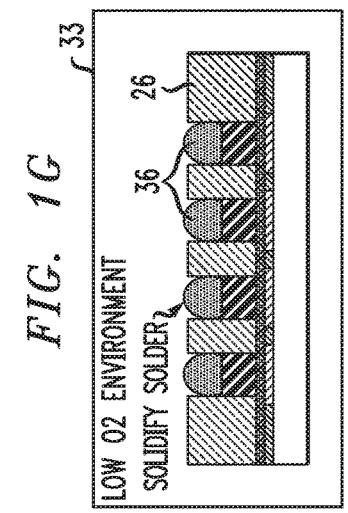
FIG. 1G LOW O2 ENVIRONMENT SOLIDIFY SOLDER
33  26  36
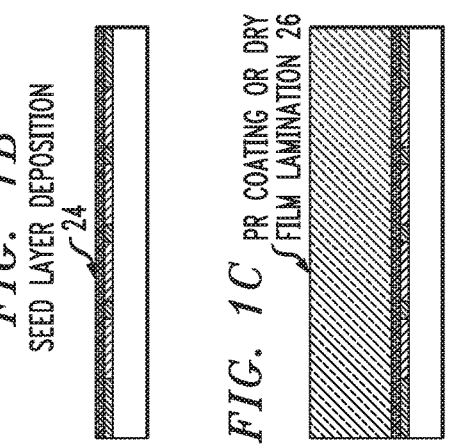
FIG. 1J FLIP CHIP ASSEMBLY
CHIP  36  20  21  35  37  SUBSTRATE
FIG. 1D PR OR DRY FILM PATTERNING
28

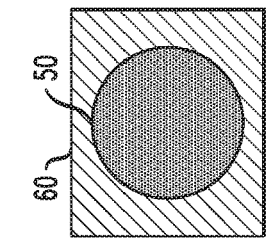
FIG. 2A
ROUND WAFER WITH PADS AND SEED LAYER
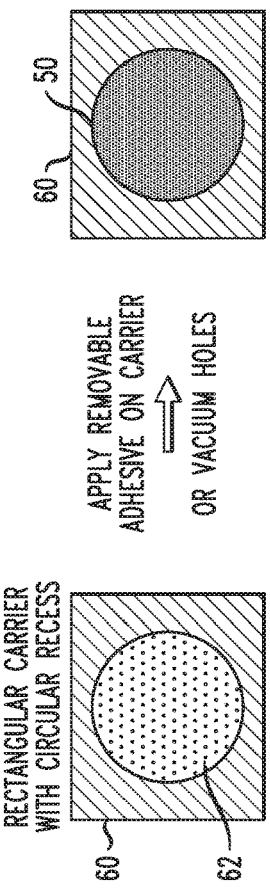
FIG. 2B
RECTANGULAR CARRIER WITH CIRCULAR RECESS
+
APPLY REMOVABLE ADHESIVE ON CARRIER OR VACUUM HOLES
FIG. 2C
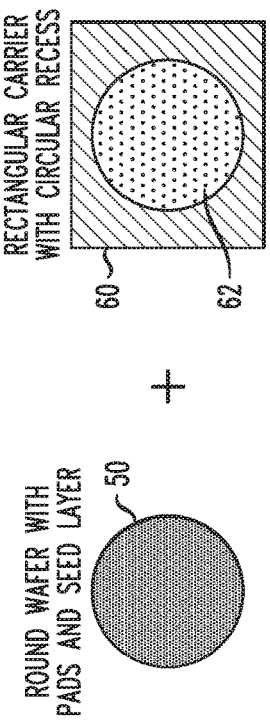
DRY FILM LAMINATION AND PATTERNING
FIG. 2D
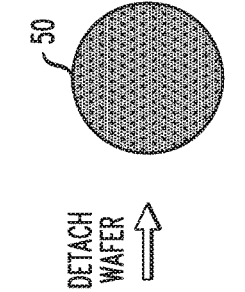
COPPER ELECTROPLATING AND IMS
FIG. 2E
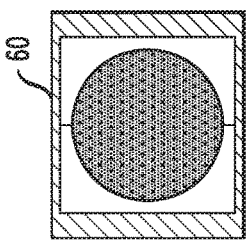
REMOVE DRY FILM
FIG. 2F
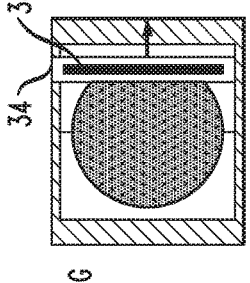
DETACH WAFER
FIG. 2G
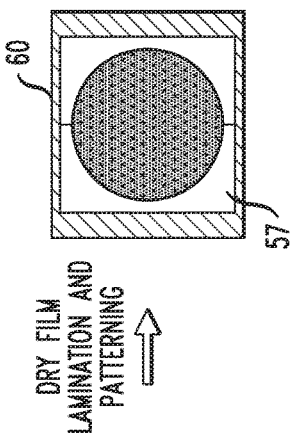

WAFER WITH Cu SEED LAYER
50

PHOTORESIST FILM DEPOSITION

PATTERNING AND Cu PLATING
50A

SQUARE WAFER CARRIER
60
62
REUSE FIXTURE

PLACE WAFER ON CARRIER
IMS
50A
34

60
62

SEPARATE WAFER STRUCTURE
50A

REMOVE PHOTORESIST FILM AND ETCH Cu SEED LAYER
50B

FINISH

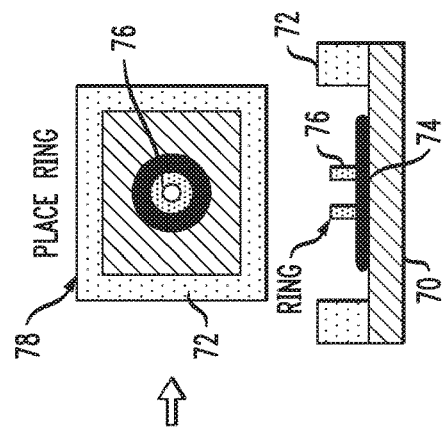
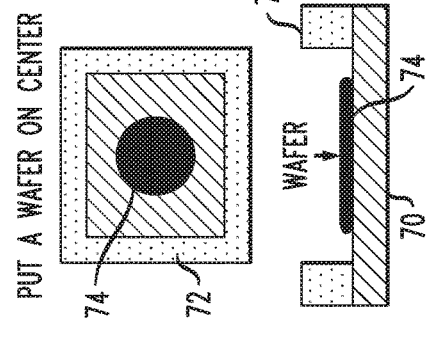
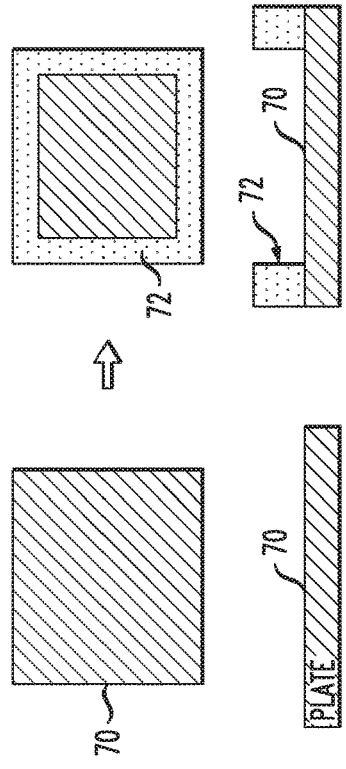
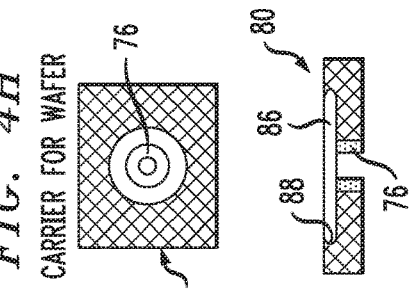
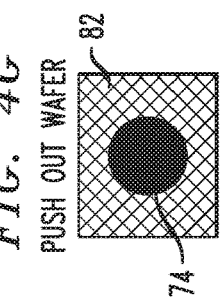
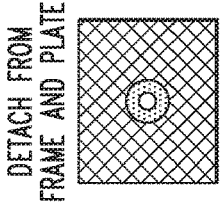
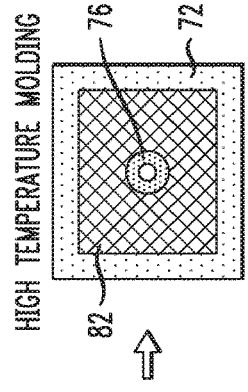
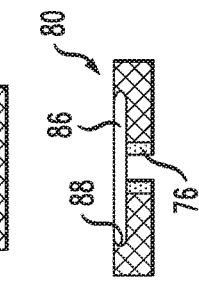
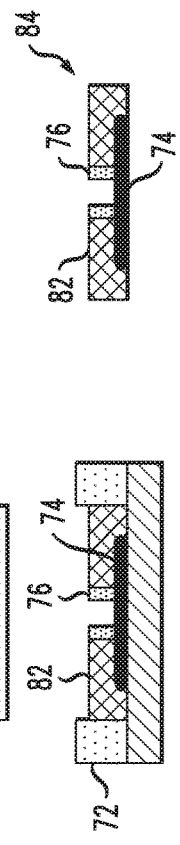

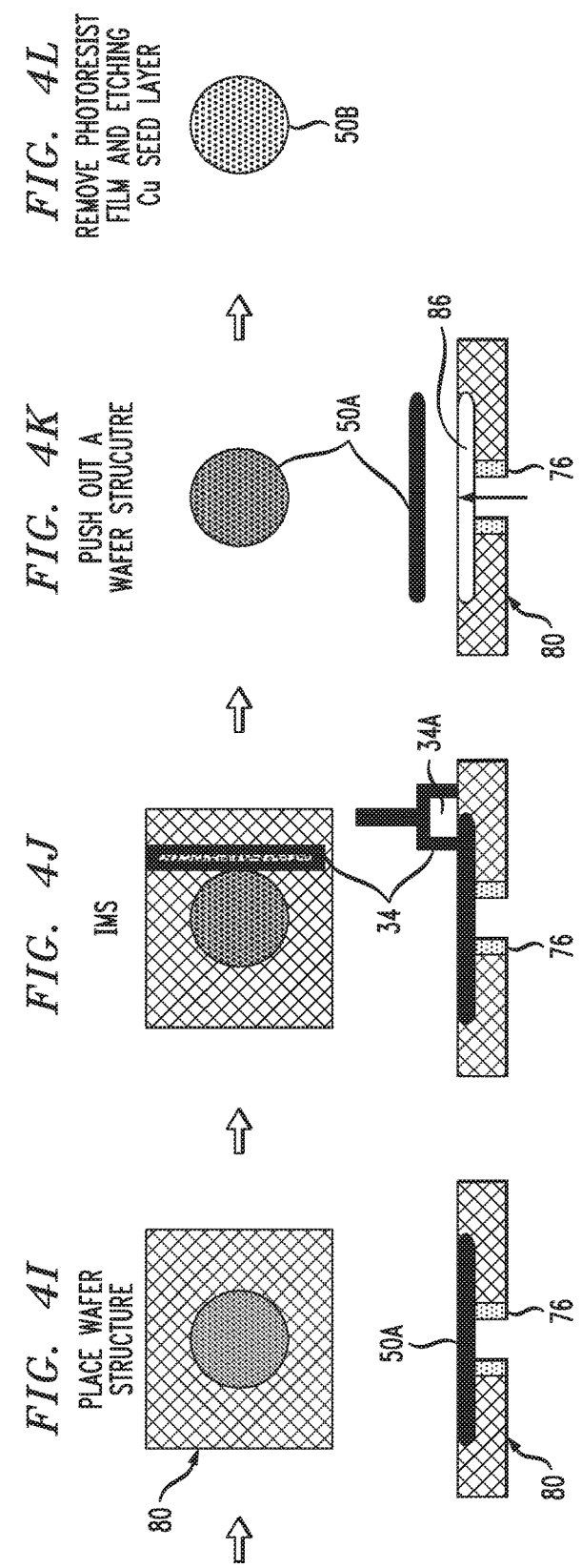

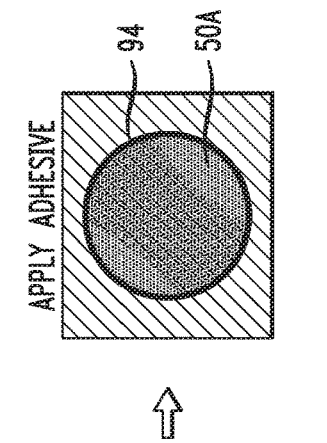
FIG. 5A
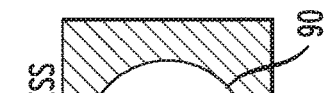
FIG. 5B FORM RECESS
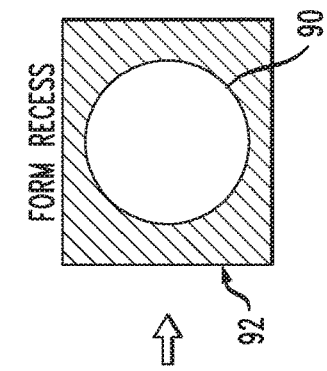
FIG. 5C PLACE WAFER STRUCTURE
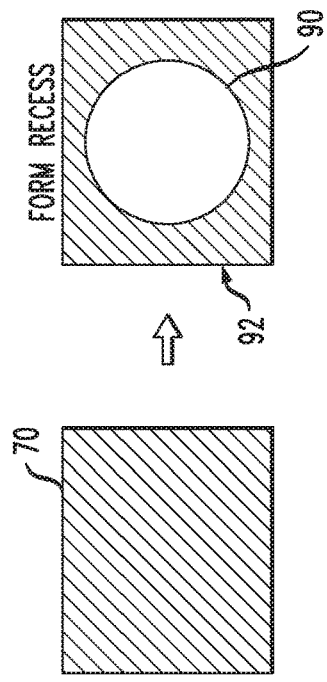
FIG. 5D APPLY ADHESIVE
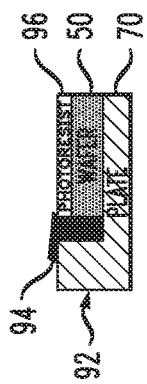
FIG. 5DD
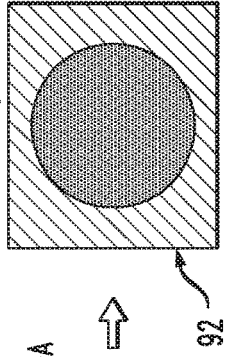
FIG. 5E CURE/FLATTENING
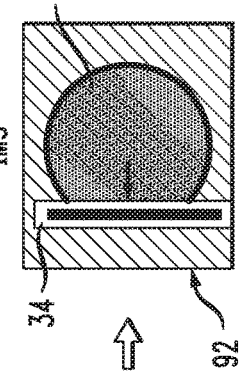
FIG. 5EE
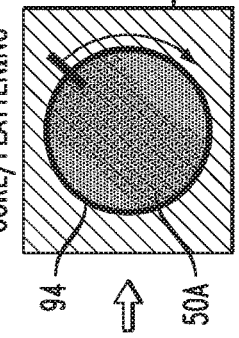
FIG. 5F IMS
FIG. 5G REMOVE ADHESIVE/PHOTORESIST

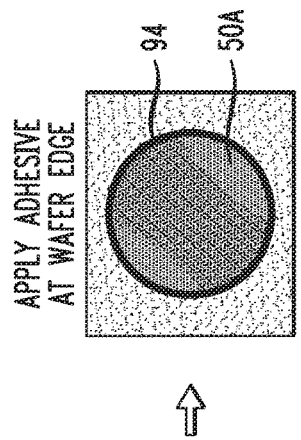
FIG. 6A
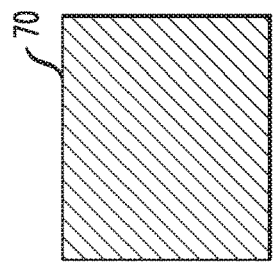
FIG. 6B
MOUNT FRAME
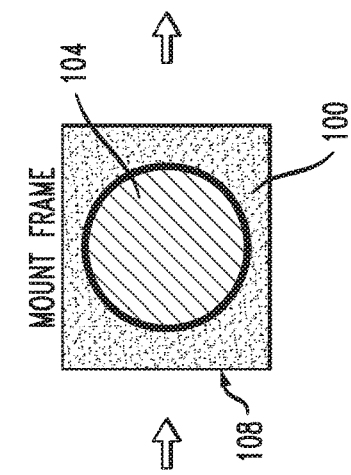
FIG. 6C
ADD SPACER, ADHESIVE
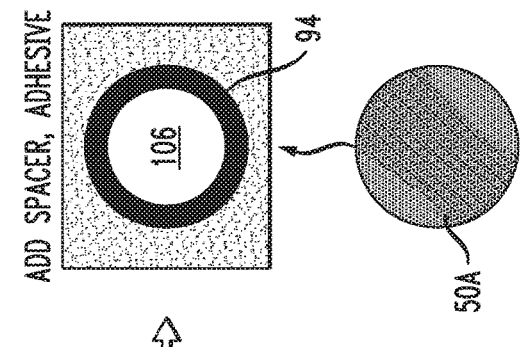
FIG. 6D
APPLY ADHESIVE AT WAFER EDGE
FIG. 6DD
FIG. 6E
CURE/FLATTENING
FIG. 6EE
FIG. 6F
IMS
FIG. 6G
REMOVE ADHESIVE/PHOTORESIST

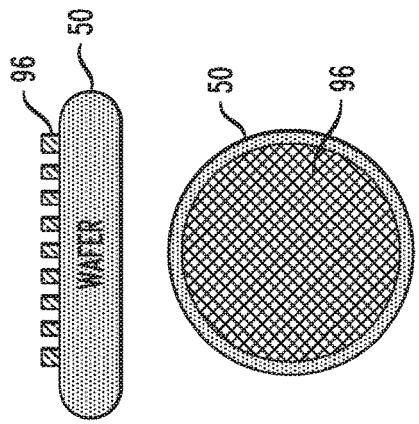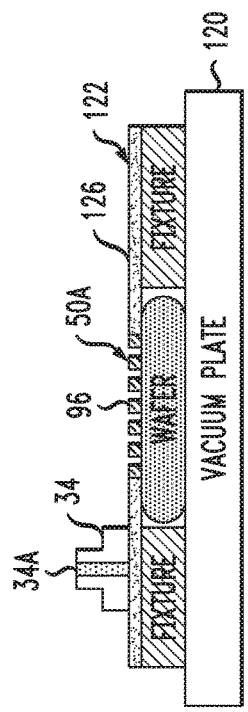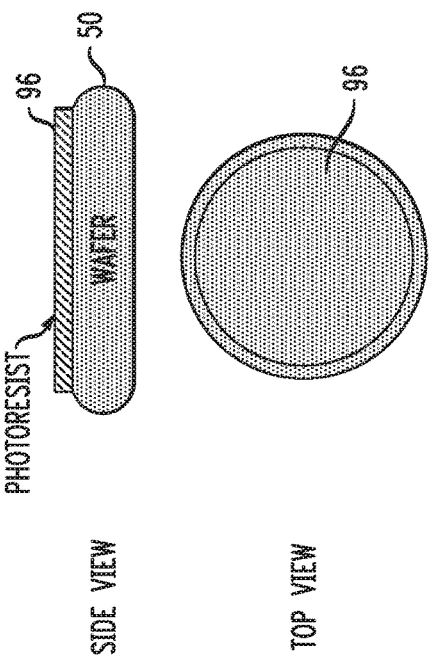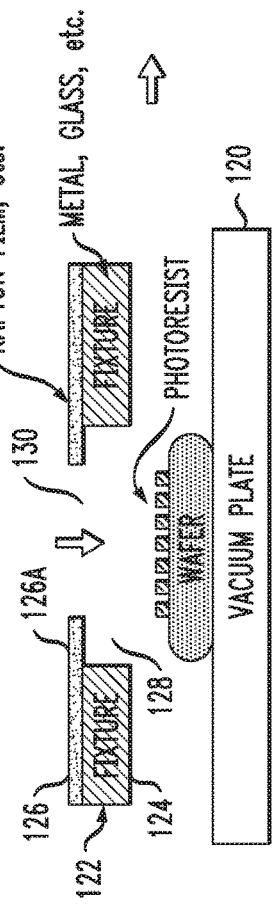

DIRECT INJECTION MOLDED SOLDER PROCESS FOR FORMING SOLDER BUMPS ON WAFERS

FIELD

The present invention generally relates to the electrical and electronic arts and, more particularly, to injection molded solder techniques, and solder deposition on substrates.

BACKGROUND

Flip chip technology has been widely used as it allows a high I/O count, high density interconnection scheme with proven performance and reliability. Solder bumps are deposited on contact pads on chip surfaces and the chips are then flipped and positioned such that the solder bumps are aligned with matching pads of an external circuit. Solder reflow completes the interconnection process, after which underfill material is introduced to fill the spaces about the interconnections.

Flip chip interconnection assemblies have included copper pillars with solder caps. The copper pillars and solder caps may be formed by electroplating processes, which can lead to non-uniformity in the heights of the pillars and caps. Therefore, the solder volume in the pillar-cap structures may vary and compromise the ability to ensure reliable interconnections following reflow.

U.S. Pat. No. 6,213,386 of Inoue et al., entitled 'Method of forming bumps,' discloses wherein preformed solder balls and a tool having a large number of through-holes are used, and under the condition that the through-holes of the tool are aligned with the pads of the semiconductor device, the solder balls are charged into the through-holes, pressed to be fixed on the pads, and then reflowed to form bumps. This method also does not disclose forming bumps of uniform height on non-uniform copper pillars.

SUMMARY

Principles of the present disclosure provide techniques and apparatus for depositing mask layers on wafers followed by direct IMS (injection molded solder) for forming solder bumps on the wafers. In one aspect, an exemplary method includes providing a round wafer having a circular peripheral edge and a plurality of electrically conductive contact pads, depositing a photoresist layer on the wafer, patterning the photoresist layer such that a plurality of channels are formed over the contact pads, each of the channels having substantially the same height, and depositing a layer of metal over the contact pads. The method further includes providing a carrier including a recess having a circular configuration. Subsequent to depositing and patterning the photoresist layer and depositing the layer of metal over the contact pads, the round wafer is positioned in the recess of the carrier such that a top surface of the carrier is coplanar with a top surface of the photoresist layer. A fill head containing molten solder is passed over the channels while the wafer is in a low oxygen environment and molten solder containing no flux is injected into the channels from the fill head. The solder is allowed to solidify, whereby the solder adheres to the metal and forms bumps. The photoresist layer is then removed from the wafer.

In accordance with a further aspect of the disclosure, a method is provided that includes obtaining a carrier comprising a recess having a circular configuration and an elastomeric body portion adjoining the recess, obtaining a round wafer structure including a wafer having a plurality of electrically conductive structures and a photoresist layer on the wafer, the photoresist layer including a plurality of channels aligned with the electrically conductive structures, and placing the wafer structure in the recess such that a top surface of the photoresist layer is coplanar with a top surface of the carrier and the elastomeric body portion of the carrier engages a peripheral edge of the wafer structure, thereby forming a compliant seal between the wafer structure and the elastomeric body portion. The method further includes passing a fill head containing molten, flux-free solder over the wafer structure and carrier while injecting the molten, flux-free solder into the channels such that the solder contacts the electrically conductive structures and fills the channels and solidifying the solder in the channels, forming solder bumps on the wafer.

A further aspect of the present disclosure provides a method that includes obtaining a structure including a plate and a frame mounted to the plate, the frame defining a rectangular enclosure, a round wafer on the plate and within the enclosure, a ring positioned on the wafer, the ring and wafer being concentric, and a carrier body comprising an elastomeric polymer material and having a rectangular configuration within the enclosure and between and contacting the frame and the ring. The method further includes detaching an assembly comprising the elastomeric polymer material, the ring and the wafer from the structure and forming a round recess within the elastomeric polymer material by detaching the wafer from the elastomeric polymer material.

A method in accordance with a further aspect of the disclosure comprises obtaining a round wafer structure including a wafer having a plurality of electrically conductive structures and a photoresist layer on a top surface of the wafer, the photoresist layer including a plurality of channels aligned with the electrically conductive structure. The method further includes obtaining an assembly including a plate and a fixture, the fixture comprising a base, a first opening extending through the base, and an annular layer extending over the opening in the base, the annular layer including a second opening aligned with the first opening, the plate and fixture being in opposing relation. The round wafer structure is placed on the plate. The base of the fixture is caused to adjoin the plate such that the round wafer structure is positioned within the first opening and the annular layer adjoins the top surface of the wafer. An injection head traverses the wafer structure and injects molten solder within the channels.

A first exemplary assembly for facilitating one or more of the procedures discussed above includes a rectangular carrier body comprising a recess having a circular configuration and an elastomeric body portion defining an annular side wall of the recess. The assembly further includes a fill head configured for depositing molten solder adjoining the rectangular carrier.

A second exemplary assembly includes a wafer carrier having a rectangular configuration, a top surface, a bottom surface, and a recess having a circular configuration, the recess having a bottom surface between and parallel to the top and bottom surfaces of the wafer carrier and being bounded by an annular wall extending between the top surface of the wafer carrier and the bottom surface of the recess. The assembly further includes a round wafer structure positioned within the recess, the wafer structure having a peripheral edge and comprising a wafer and a patterned mask layer on the wafer. An adhesive seal is between the peripheral edge of the wafer structure and the annular wall, the adhesive seal having a top surface coplanar with a top surface of the mask layer and the top surface of the wafer carrier.

A wafer carrier is provided in accordance with the present disclosure that facilitates solder bumping. An exemplary wafer carrier includes a rectangular carrier body comprised of an elastomeric material having a modulus of elasticity of at least one MPa and having a top surface and a bottom surface, the elastomeric material further having sufficient temperature resistance to avoid thermal breakdown when subjected to a 260° C. temperature for ten minutes or less. The wafer carrier further includes a recess extending within the carrier body and having a circular configuration and a bottom surface between and parallel to the top and bottom surfaces of the carrier body. An annular wall of the exemplary wafer carrier wall has a concave configuration bounding the recess. A passage extends between the bottom surface of the carrier body and the bottom surface of the recess.

An apparatus is provided in accordance with a further exemplary embodiment. The apparatus includes an assembly including a plate and a fixture, the fixture comprising a base, a first opening extending through the base, and a surface layer on the base and extending over the opening in the base. The surface layer has a low friction top surface and includes a second, circular opening aligned with the first opening. The plate and fixture are in opposing relation. The apparatus further includes an injection head configured for injecting molten solder, the injection head including a slot facing the surface layer and having a length at least equal to the diameter of the second opening.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

BRIEF DESCRIPTION OF THE DRAWINGS

FIGS. 1A-J schematically illustrate an IMS procedure for wafer bumping including electroplating of Cu pillars which have ideal uniform height;

FIGS. 2A-G show a flow diagram that schematically illustrates steps for wafer bumping round wafers;

FIGS. 4A-4L show a flow diagram illustrating fabrication and use of an elastomeric polymer mold;

FIGS. 5A-G show a flow diagram illustrating fabrication and use of a fixture employed in an IMS procedure;

FIG. 5DD is a cross sectional view of the step shown in FIG. 5D;

FIG. 5EE is a cross sectional view of the step shown in FIG. 5E;

FIGS. 6A-G show a flow diagram illustrating fabrication and use of a fixture employed in an IMS procedure;

FIG. 6DD is a cross sectional view of the step shown in FIG. 6D;

FIG. 6EE is a cross sectional view of the step shown in FIG. 6E, and

FIGS. 7A-D show a flow diagram illustrating exemplary steps for preparing wafers and forming solder bumps thereon.

DETAILED DESCRIPTION

Figure 3A:
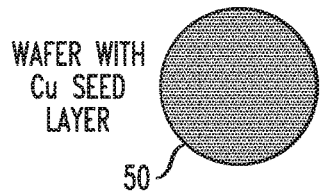
FIGS. 3A-H show a flow diagram illustrating steps including patterning and electroplating of a round wafer, solder injection, and removal of mask film.

Initially, the complete disclosure of commonly assigned U.S. patent application Ser. No. 13/154,412 filed Jun. 6, 2011, entitled "Injection Molded Solder Process for Forming Solder Bumps on Substrates" is expressly incorporated herein by reference in its entirety for all purposes.

Referring to FIGS. 1A-J, steps in performing a method in accordance with one aspect of the present disclosure are shown. A wafer 20 including a passivation layer 21 and rows of I/O pads 22 is shown in FIG. 1A. The wafer may be comprised of silicon or other suitable composition. The pads 22 are made from a conductive material such as copper or aluminum. A thin, conductive seed layer 24 is deposited on the wafer as shown in FIG. 1B. The seed layer is comprised of a suitable metal(s) such as TiCu. A photoresist layer 26 is applied to the seed layer as shown in FIG. 1C. The layer 26 may be applied as a coating or by laminating a dry film using heat and pressure. Photoresist (PR) deposition and dry film lamination are techniques known in the art for providing such a layer. The layer 26 preferably has a thickness between 5-200 μm, and more preferably between 25-100 μm. The layer is patterned in the step shown in FIG. 1D by subjecting the photoresist layer to light through a mask (not shown) and removing developed or undeveloped photoresist, depending on the type of photoresist employed. If a laminated film is employed, the protective layer (not shown) above the photoresist is removed shortly before photoresist development. As shown in the figure, the photoresist above the pads 22, following etching and washing, is removed. A plurality of vertical channels 28 are accordingly formed over the pads, each having a height equal to the thickness of the PR layer 26. Because the photoresist layer has a substantially uniform thickness over the entire wafer, the channels 28 have a substantially uniform height. As shown in FIG. 1E, metal, preferably copper is deposited over each pad 22 by electroplating, forming copper pillars 30. Electroplating is the preferred form of copper deposition for forming pillars of sufficient height, particularly for fine pitch applications. In addition to copper, nickel, gold, or any combination of them can be deposited to form the pillars. The pillars are ideally substantially uniform in height, for example between about 2-60 μm. In practice, however, the heights of the pillars may not be uniform. A twenty percent variation of pillar height in a chip is possible. As the height of the copper pillars increases and the pitch among them decreases, the height variation accordingly also increases. In some applications, the heights of the copper pillars may exceed half the heights of the channels. In addition to the differences in heights of the copper pillars from channel to channel, one side of a pillar in a particular channel can be higher than another side by several microns. As discussed below, the techniques employed in accordance with the invention accommodate possible non-uniformity in the heights of the pillars 30.

Referring to FIG. 1F, each channel 28 is injected with molten solder 32 by a fill head 34 that traverses the wafer. The cavities defined by the channels are filled completely to the tops, thereby ensuring uniformity of height of the resulting copper/solder bumps. No solder flux is required nor is any employed in the preferred embodiment. The absence of flux prevents volume shrinkage. The molten solder is directly injected into the channels in a low oxygen environment 33, preferably less than 10,000 ppm in a nitrogen environment. Alternatively, a forming gas environment including nitrogen and hydrogen may be employed (e.g. 90% $N_2$, 10% $H_2$). The solder solidifies as shown in FIG. 1G, also in a low oxygen environment, forming the bumps 36 as shown due to solder surface tension. The bumps preferably extend over the tops of the channels as shown. Following solidification of the solder, the photoresist layer 26 is stripped (etched) away, followed by etching of the seed layer as shown in FIGS. 1H and 1I, respectively. The resulting assembly is flipped over so that its pads are aligned with matching pads on a circuit board or another chip or wafer such as the pads 37 on the substrate 35 as shown in FIG. 1J. The substrate pads may have solder bumps. Electrical connection of the two assemblies is facilitated by solder reflow or thermal compression bonding (not shown). The above-described process does not require use of a mask, does not limit bump pitch, allows the use of a variety of solder materials, including binary, ternary and quaternary compositions, and avoids waste of materials. It also compensates for non-uniformity in pillar height as IMS fills the channels of the photoresist. As uniform thickness of the photoresist, whether deposited or applied using a dry film, is easily achieved, the resulting bumps will be substantially uniform in height regardless of variations in height of the copper pillar portions of the bumps. Flip chip assembly yield is accordingly improved over methods such as electroplating. Optionally, if required, a dry film of photoresist may be cured by heat treatment in an oven or by UV cure from flood exposure before molten solder injection and after depositing metal.

The above-referenced method is not limited to providing solder bumps of one size or composition throughout the wafer. By varying channel diameters, a variety of sizes with same height of solder bumps 36 may be provided. Different solder compositions can be provided by, for example, using IMS of one solder type, e.g. SnCu, in one portion of a wafer and filling the channels of another portion with, for example, molten SnAg solder.

FIGS. 2A-G show a flow diagram of a process for facilitating the production of solder bumps wherein the top surfaces of the wafer 50 and rectangular carrier 60 are maintained in a coplanar relationship during the IMS process. The carrier, which may comprise glass, poly-Si, metal, polymer, ceramic or other suitable material, includes a circular recess 62 as shown in FIG. 2B. The depth of the recess is substantially the same as the thickness of the wafer 50 to be processed so that the top surfaces of the carrier and wafer are as coplanar as possible. Its diameter is substantially the same as that of the wafer while providing minimum clearance for allowing the wafer to be inserted therein. Any such clearance should not allow the admission of photoresist or molten solder when the fill head traverses the carrier and wafer. The recess 62 can be formed integrally with the carrier or by a separate element (not shown) that defines an opening for receiving the wafer. Such a separate element may comprise one or more pieces. As in the previous example, a removable adhesive and/or a plurality of vacuum holes may be provided in the carrier for maintaining the wafer in place. Upon mounting the wafer in the recess, dry film lamination followed by patterning, copper electroplating, IMS, etc. as shown in FIGS. 2D-G is performed. The dry film 57 is applied to the wafer and adjoining surface of the carrier 60, forming a planar surface that is engaged by the fill head 34 after patterning. The width of the dry film exceeds the length of the slot 34A of the fill head as shown in FIG. 2E. Solder injection is preferably discontinued when the slot 34A is fully past the wafer but not beyond the dry film layer.

Advantages of IMS for wafer bumping as described herein include the absence of requirements for a mask, no limitation with respect to bump pitch, the ability to use binary, ternary or quaternary solder compositions, little or no waste of materials, and uniform bump heights. As discussed above, the preferred method of forming copper pillars through electroplating copper above the contact pads in the channels often and probably usually results in non-uniformity of pillar height.

One or more embodiments of the invention may employ almost any kind of solder. Eutectic SnPb and Pb-free solder (pure Sn, SnAgCu, SnAg, SnCu, SnBi, SnIn, SnAu, SnAgCuZn etc.) are non-limiting examples of suitable solders. In contrast, it is difficult to plate ternary or quaternary solder compositions using electroplating methods and difficult to control the volume of electroplated solder. When the solder is injected into the channels 28, the temperature of solder is above its melting temperature but below the melting temperature of the photoresist. The oxygen concentration in the nitrogen environment is preferably less than 10,000 ppm. The nitrogen does not have to be perfectly pure and the forming gas does not have to have the exact composition as described elsewhere. The environment in which IMS and solder solidification occurs should preferably, however, allow formation of structures such as shown in FIGS. 1(*f*) and 1(*g*), respectively.

The absence of flux using IMS as discussed above is preferred as there is no material volume shrinkage. Stencil printing using dry film and solder paste requires cleaning of flux residue, possible reaction between flux and dry film that could make a residue that is difficult to clean, and non-uniform bump heights after reflow. Using stencil printing with solder paste, it is very difficult to form uniform bump height when copper pillars have non-uniform height because the ratio of solder powders/flux is different from channel to channel. In addition, the height of reflowed solder bumps may be below the surface of dry film resist because flux volume in solder paste does not contribute to the height of the solder bumps.

In one or more embodiments, the step of directly injecting the molten solder is carried out with an injection molded solder fill head, and an additional step includes causing relative motion, preferably translational motion, between (i) the head and (ii) the substrate, during the injecting.

The method described above with respect to FIG. 2 includes both patterning and electroplating steps with the wafer 50 mounted to the rectangular carrier 60. These steps are followed by an IMS process while the wafer remains on the carrier. Rectangular carriers, which are preferably square, allow linear movement of the IMS injection head without solder leakage. A disadvantage of the method illustrated in FIG. 2 is that the patterning process and copper electroplating have to be done when the wafer is within a fixture such as the carrier 60. Accordingly, the process is not amenable to the use of spin coated photoresist materials. The processes described below employ a carrier only for the IMS process and not for photoresist deposition or patterning. Subsequent to photoresist deposition by, for example, spin coating or lamination of dry film, and patterning the photoresist layer, the round wafer structure, which comprises the wafer and patterned photoresist layer, is positioned in the circular recess of the carrier such that a top surface of the carrier is coplanar with a top surface of the photoresist layer. Various techniques are described below for facilitating the direct injection molded solder process for forming solder bumps on wafers.

Figure 3B:
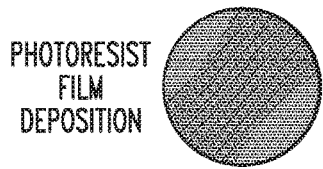
Figure 3C:
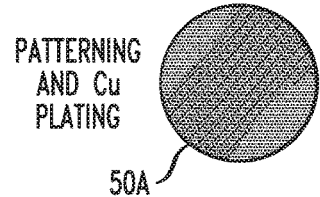
Figure 3D:
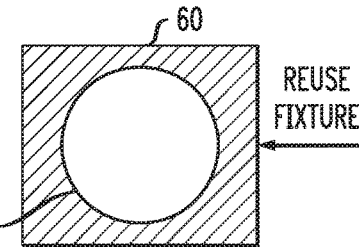
Figure 3E:
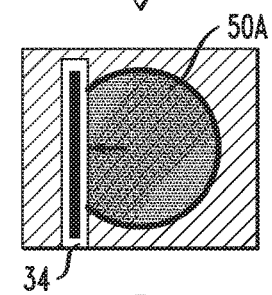
Figure 3F:
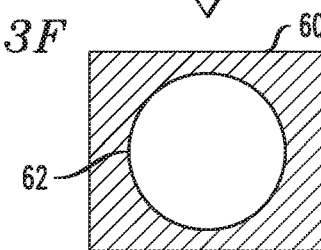
Figure 3G:
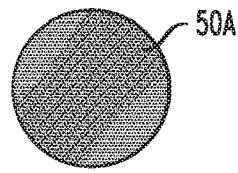
Figure 3H:
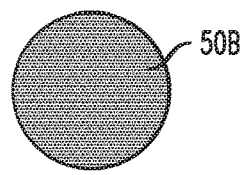

Referring to FIGS. 3A-3H, a method is shown in the flow diagram that employs a carrier or fixture only for the IMS procedure. A wafer 50 having a copper seed layer as shown in FIG. 3A is provided. A photoresist film is deposited on the wafer 50, by spin coating or lamination of dry film, as shown in FIG. 3B. The wafer is not mounted to a wafer carrier later used for the IMS procedure during this step. Spin coating is a process familiar to those of skill in the art and is a procedure to apply uniform thin films to flat surfaces. A fluid is deposited on a substrate, which is then rotated at high speed to spread the fluid by centrifugal force. As shown in FIG. 3C, the photoresist is patterned and the wafer is subjected to an electroplating process to form copper pillars on the wafer. (See FIGS. 1D and 1E, which show patterning followed by electroplating.) Alternatively, electroless deposition of ball limiting metallurgy (BLM) provides solder-wettable structures (not shown) on the wafer. In this case, a copper seed layer is not required. Once the patterned, electroplated wafer structure 50A has been obtained or fabricated, a rectangular (preferably square) carrier 60 is manufactured or otherwise obtained as shown in FIG. 3D. The carrier includes a circular recess or hole 62 for receiving the wafer. The wafer structure 50A is then subjected to an IMS procedure as shown in FIG. 3E, causing the openings in the patterned mask to be filled with molten solder. Following the IMS procedure, the wafer structure 50A is separated from the carrier, allowing the carrier 60 to be reused. The separated wafer structure 50A, as shown in FIG. 3G, is subjected to further processing, e.g. etching, to remove the photoresist film and the seed layer, forming a wafer product 50B including solder bumps (not shown). The use of two separate processes, only one of which employs a carrier, facilitates manufacture and higher throughput.

FIGS. 4A-L provide a flow diagram showing an exemplary process for facilitating the method of FIGS. 3A-G. The sectional views accompanying the top plan views in the flow diagram are enlarged for purposes of illustration. A rectangular, and preferably square plate 70 having planar top and bottom surfaces is provided, as shown in FIG. 4A. The plate may be comprised of glass, metal, ceramic material, polymeric film, or other suitable substances. A rectangular frame 72 is affixed to the plate. The frame 72 may be comprised of glass, metal, ceramic, polymeric or other material that can withstand the temperature range associated with molding a polymer mold therein, as described further below. The frame defines a rectangular, preferably square enclosure with the plate to which it is affixed, as best shown in the top plan view of FIG. 4B. It will be appreciated that the frame 72 and plate 70 may be of integral construction rather than distinct elements. Referring to FIG. 4C, a wafer 74 is placed at the center of the rectangular/square enclosure defined by the plate and frame. The wafer does not need to be usable for electronic applications but should have the same dimensions as wafers that are later to be used for such applications. A ring 76 is positioned on the wafer 74. While the wafer may be adhered to the plate 70, the ring is preferably either not attached to the wafer or easily detachable therefrom. The ring 76 may be comprised of a metal such as copper and has a cylindrical wall. The wall of the ring 76 is concentric with the round wafer 74. The plate, frame, wafer and ring comprise the assembly 78 shown in FIG. 4D, which is used for fabricating an elastomeric polymer mold.

Referring to FIG. 4E, a polymeric material is deposited within the enclosure defined by the plate, the frame and the outer surface of the ring 76. The material is subjected to a temperature range sufficient to cause the polymeric material to form a wafer carrier 80 comprised of the ring 76 and a rectangular polymeric body 82 having elastomeric properties and a recess having a circular configuration. In accordance with an exemplary embodiment, the material comprising the polymeric body 82 of the wafer carrier should have certain attributes. A modulus of elasticity of at least one MPa (megapascal), and more preferably three to thirty MPa is one such attribute. The material should further be capable of high elongation without breaking or tearing: at least 30% elongation, and more preferably 100% or more without damage. Thermal breakdown of the material should not occur at temperatures associated with the temperature of molten solder that is likely to contact the wafer carrier. In an exemplary embodiment, thermal breakdown of the fully cured material would not occur when the material is exposed to a temperature of 260° C. for ten minutes. (Thermal breakdown can be determined from a color change in the material, hardening of the material where compliance is reduced, and/or outgassing causing contamination of process surfaces.) Viscosity of the material should be at least 25,000 cps, and more preferably, 50,000 cps or more and as high as 500,000 cps. The viscosity should be sufficient to allow self-leveling or easy drawdown prior to curing, but not so low as to cause capillary flow into surfaces that are in dry contact. The mold material used to form the polymeric body 82 is comprised of a base material and hardener in one or more exemplary embodiments. The base material and hardener are mixed and allowed to cure at room temperature or at an elevated temperature (e.g. over 100° C.) to expedite curing. The elastomeric carrier material forms a compliant and sufficiently tight seal with respect to the wafer structure 50A when cured to prevent the ingress of molten solder during the IMS procedure shown in FIG. 4J along the edge of the wafer structure or between the bottom surface of the wafer structure and the carrier. Suitable elastomeric mold materials are commercially available, such as SILASTIC® E RTV silicone rubber or DOW Corning 3120 RTV Silicone Rubber.

An assembly 84 comprising the polymeric body 82, ring 76 and wafer 74 is detached from the plate/frame assembly as shown in FIG. 4F. The wafer 74 is then detached from the assembly 84 by exerting an upward force through the ring as shown in FIG. 4G, resulting in the formation of the completed carrier 80 as shown in FIG. 4H. The carrier 80 comprises the polymeric body 82 and the ring 76. Upon removal of the wafer 74, a wafer-size, circular recess 86 is formed in the polymeric body 82. The peripheral wall 88 of the recess may be concave as shown to facilitate retention of a wafer 50 placed therein. The bottom surface of the recess is flat and parallel to the top and bottom surfaces of the polymeric body 82. The passage extending between the bottom surface of the polymeric body and the bottom surface of the recess 86, preferably formed by the rigid ring 76, facilitates wafer removal. It further facilitates wafer structure insertion as air can be displaced through the bottom of the carrier. The carrier 80 is accordingly adapted for receiving a wafer structure 50A suitable for electronic applications, allows quick and easy wafer structure insertion and removal without damaging the wafer, and forms an effective, compliant seal about the peripheral edge of the wafer structure.

Referring to FIG. 4I, a wafer structure 50A is provided that has been processed in the manner described above with respect to FIGS. 3A-C. The wafer structure 50A is positioned in the recess 86 of the wafer carrier 80. The recess has substantially the same dimensions as the electroplated, patterned wafer whereby the top surface of the wafer structure, namely the mask layer, is coplanar with the top surface of the carrier 80. The elastomeric properties of the polymeric body 82 of the carrier adjoining the recess ensure an effective, tight seal between the carrier and the edge portions of the wafer structure. The matching configurations of the convex peripheral edge of the wafer structure and the concave peripheral wall 88 of the recess 86 further enhance wafer retention and sealing. A fill head traverses 34 the wafer structure and carrier while injecting molten solder 34A into the photoresist openings and onto the wafer structure as shown in FIG. 4J. (FIGS. 1F and 1G show molten solder deposition and solder bump formation in greater detail, similar to the step shown in FIG. 4J and the step immediately following that shown in FIG. 4J when the solder subsequently solidifies.) The top surface of the polymeric body 82 is sufficiently durable during the process of injecting molten solder such that it will not undergo chemical or mechanical breakdown that would allow the flow of molten solder into protected regions of the wafer or that could cause contamination to process surfaces. The top surface of the polymeric body should also cause little friction with the fill head as it traverses the wafer and carrier, allowing smooth movement of the fill head without solder leakage. The polymeric body itself can have a surface that does not cause excessive friction with the fill head. Alternatively, a polymer film (e.g. Kapton) may be applied to the top surface of the polymeric body 82 to reduce friction. The wafer structure 50A is pushed out of the carrier 80 by a tool (not shown) that enters the ring 76 and engages the bottom surface of the wafer, such as shown in FIG. 4K. The elastomeric properties of the polymeric body facilitate such removal without causing damage to the wafer structure 50A. The wafer then undergoes further processing, such as removal of the photoresist and seed layer as shown in FIG. 4L, to form a wafer product 50B.

An alternative method and wafer carrier are shown in FIGS. 5A-G. A rectangular, and preferably square plate 70 having planar top and bottom surfaces is provided, as shown in FIG. 5A. The plate may be comprised of glass, metal, ceramic material, polymeric film, or other suitable substances. A circular recess 90 having a bottom surface parallel to the top and bottom surfaces of the plate is formed mechanically or by etching in the plate as shown in FIG. 5B, forming a wafer carrier 92. The diameter of the recess 90 is slightly larger than the diameter of a wafer structure 50A and has a depth that is substantially the same as the thickness of the patterned, electroplated wafer structure 50A. When such a wafer structure is placed in the recess as shown in FIG. 5C, its top surface (the photoresist layer) will be substantially coplanar with the top surface of the plate. Once the wafer structure is positioned on the carrier 92, an adhesive is deposited along the outer edge of the wafer as shown in FIG. 5D. The adhesive 94 forms a seal between the wafer and carrier as best shown in FIG. 5DD. The adhesive is then cured and flattened as shown in FIG. 5E, resulting in the structure shown in FIG. 5EE. A blade having a sharpened edge may be employed to remove excess adhesive material, thereby forming the flat adhesive surface. The top surfaces of the plate, wafer and adhesive are coplanar. The structure is subject to an IMS process in FIG. 5F wherein the fill head 34 deposits molten solder in the openings (not shown) in the spin coated or film laminated phtoresist film 96 previously formed on the wafer. The top surface of the adhesive 94 is sufficiently durable during the process of injecting molten solder such that it will not undergo chemical or mechanical breakdown that would allow the flow of molten solder into protected regions of the wafer structure or that could cause contamination to process surfaces. The top surface of the adhesive should also cause little friction with the fill head as it traverses the wafer structure and carrier 92, allowing smooth movement of the fill head 34 without solder leakage. Suitable adhesives known to those of skill in the art in flip chip packaging are commercially available, such as EA-6900 microelectronic adhesive produced by Dow Corning Corp. Once the IMS procedure has been completed, the adhesive 94 and photoresist 96 are removed while the wafer structure remains on the carrier 92 as shown in FIG. 5G. Adhesive removal can be effected through the use of solvents, by mechanical means such as a knife blade, or laser cutting. The photoresist is typically removed by etching, as known to those of skill in the art. The resulting wafer product is then easily removed from the carrier (not shown) where it can be diced and/or otherwise processed.

A further method is disclosed in FIGS. 6A-G. This method also involves using a carrier only for the IMS process, wherein a wafer has previously been subjected to photoresist film deposition as shown in FIG. 3B, for example by spin coating or film lamination, followed by patterning and electroplating. A rectangular, and preferably square plate 70 having planar top and bottom surfaces is provided, as shown in FIG. 6A. The plate may be comprised of glass, metal, ceramic material, polymeric film, or other suitable substances. A frame 100 is placed on the plate and can be adhered thereto, forming a wafer carrier 108. The frame 100 in this exemplary embodiment has the same rectangular shape and dimensions as the plate and can be made of the same or different material as the plate. The frame includes a circular opening 104 which, when mounted to the plate as shown in FIG. 6B, defines a circular recess 104 large enough to accommodate a wafer. A spacer 106 having a disc-like configuration is mounted to the plate 70 within the circular recess 104 as shown in FIG. 6C and an adhesive 94 is deposited about the periphery of the spacer. The thickness of the spacer is selected to correspond to the thickness of the patterned wafer structure 50A later placed within the recess 104 so that the top surface of the frame 100 is coplanar with the top surface of the patterned, electroplated wafer structure. Referring to FIG. 6D, a wafer structure 50A having a photoresist film 96 is positioned on the spacer and within the recess. Additional adhesive is applied along the peripheral edge of the wafer structure 50A, which forms a seal between the wafer structure and frame. in this exemplary embodiment. The top surface of the photoresist film 96 is coplanar with the top surface of the frame 100, as shown in FIG. 6DD. It will be appreciated that the spacers of different thicknesses may be employed depending on the thicknesses of the wafer structures to be processed on the carrier 108. (A spacer could likewise be employed within the recess of the wafer carrier 92 shown in FIG. 5B if necessary.) Referring to FIG. 6E, the adhesive 94 is cured and flattened such that the adhesive seal formed thereby is coplanar with the top surface of the frame 100, resulting in a structure as shown schematically in FIG. 6EE. As discussed above with respect to the exemplary embodiment of FIGS. 5A-G, the top surface of the adhesive 94 is sufficiently durable during the process of injecting molten solder such that it will not undergo chemical or mechanical breakdown that would allow the flow of molten solder into protected regions of the wafer structure or that could cause contamination to process surfaces. The top surface of the adhesive should also cause little friction with the fill head as it traverses the wafer and carrier, thereby allowing smooth movement of the fill head without solder leakage. FIG. 6F shows an IMS procedure in which molten solder is deposited in the openings of the film mask, similar to the process as shown in FIG. 1F. The adhesive and photoresist can be removed while the wafer structure is still on the carrier 108. Alternatively, photoresist and the seed layer can be removed following removal of the wafer structure 50A from the carrier 108.

FIGS. 7A-D show selected steps of an alternative exemplary process for forming solder bumps on wafers. Like the methods described above with respect to FIGS. 3-6, the process is amenable to application of photoresist to wafers by film lamination or spin coating. Referring to FIG. 7A, a layer of photoresist 96 is applied to a wafer 50. The photoresist is patterned to form channels as shown in FIG. 7B followed by copper electroplating (not shown). The outer edge of the photoresist layer is trimmed to a desired diameter. The resulting wafer structure 50A is positioned on a vacuum plate 120 that exerts a vacuum force on the bottom surface of the wafer structure, maintaining it in position on the plate. It will be appreciated that the vacuum plate is not necessarily entirely planar as shown, though a flat top surface is preferred to facilitate wafer retention. As further shown in FIG. 7C, a fixture 122 is provided above the vacuum plate 120. The fixture includes a base 124 having the same thickness as the wafer 50 and a surface layer 126 having the same thickness as the layer of photoresist 96. The surface layer is a discrete element secured to the base 124 in the preferred embodiment. The base is comprised of metal, glass, or other suitable material, and is preferably rigid. The total thickness of the fixture 122 is accordingly the same as the thickness of the wafer structure 50A. A circular opening 128 extends through the base. The surface layer may comprise a Kapton film layer having an annular portion 126A that extends within the inner surface of the base 124. The annular portion 126A includes a second opening 130 concentric with the opening 128 in the base. The second opening 130 has a diameter that is substantially the same as the diameter of the layer of photoresist. The surface layer is preferably comprised of a material that exhibits flexibility at least in the annular portion 126A thereof.

Referring to FIG. 7D, the fixture 122 is lowered such that the base 124 contacts the upper surface of the vacuum plate 120 and the annular portion 126A of the surface layer 126 is positioned on the exposed surface of the wafer 50. The flexibility of the annular portion 126A facilitates its engagement with the wafer 50 in the event the dimensions of the wafer and fixture do not correspond exactly. The inner edge of the surface layer adjoins the outer edge of the photoresist layer 96. A coplanar surface is provided by the upper surface of the surface layer 126 and the upper surface of the photoresist layer 96. A fill head 34 containing molten solder engages the surface layer 126 and is caused to traverse the wafer structure 50A, depositing molten solder in each of the channels in the patterned photoresist layer. The use of a material such as Kapton as the surface layer facilitates movement of the fill head over the wafer structure as friction is reduced. The fill head slot should have a length that equals or exceeds the diameter of the opening within the annular portion of the surface layer so that molten solder can be injected into all of the channels in the photoresist layer 96. The fill head slot 34A faces the top surface of the fixture as shown in FIG. 7D. Following the IMS procedure, the fixture and vacuum plate are separated. Vacuum is discontinued to allow removal of the wafer structure.

Given the discussion thus far, a first exemplary assembly for facilitating one or more of the procedures discussed above includes a rectangular carrier body comprising a recess having a circular configuration and an elastomeric body portion defining an annular side wall of the recess. FIG. 4H shows such a carrier body 82, recess 86 and annular side wall 88 defined by an elastomeric body portion. The assembly further includes a fill head configured for depositing molten solder adjoining the rectangular carrier. An exemplary fill head 34 configured for depositing molten solder is shown in FIG. 4J. The side wall of the recess is concave in one or more further embodiments of the assembly. One or more embodiments of the assembly further includes a rigid ring mounted to the carrier body, the rigid ring having a first open end communicating with the recess and a second open end. FIG. 4H shows such a ring 76 wherein the upper opening thereof communicates with the recess 86. The rigid ring and the recess are concentric in a further exemplary embodiment. The assembly further includes a round wafer structure comprising a wafer and a patterned photoresist layer on the wafer positioned in the recess, the wafer structure having a top surface that is coplanar with a top surface of the carrier body in one or more embodiments thereof. FIG. 4I shows a round wafer structure 50A fabricated pursuant to the exemplary steps shown in FIGS. 3A-C. As shown in the sectional view of FIG. 4I, the top surface of the wafer structure 50A is coplanar with the top surface of the carrier body of the wafer carrier 80. In one or more embodiments of the assembly, the rectangular carrier body 82 is entirely comprised of an elastomeric material. The formation of such a carrier body 82 is shown in FIG. 4E wherein the entire body is formed of a polymeric, elastomeric material. The elastomeric material comprising the carrier body 82 has a modulus of elasticity of at least one MPa as discussed above in the specification.

A wafer carrier is provided in accordance with the present disclosure that facilitates solder bumping. An exemplary wafer carrier includes a rectangular carrier body, such as the polymeric body 82 shown in FIG. 4F, comprised of an elastomeric material having a modulus of elasticity of at least one MPa and having a top surface and a bottom surface, the elastomeric material further having sufficient temperature resistance to avoid thermal breakdown when subjected to a 260° C. temperature for ten minutes or less. The wafer carrier further includes a recess extending within the carrier body and having a circular configuration and a bottom surface between and parallel to the top and bottom surfaces of the carrier body. FIG. 4H shows such a recess 86, the circular configuration thereof being shown in the top plan view thereof. An annular wall 88 of the exemplary wafer carrier 80 wall has a concave configuration bounding the recess 86. A passage extends between the bottom surface of the carrier body and the bottom surface of the recess. Such a passage is shown in FIG. 4H. In one or more exemplary embodiments of the wafer carrier, the concave configuration of the annular wall extends between the top surface of the carrier body 82 and the bottom surface of the recess. One or more embodiments of the wafer carrier further include a rigid ring mounted to the carrier body and adjoining the passage, the rigid ring having a first open end and communicating with the recess and a second open end. The elastomeric material has a modulus of elasticity between 3-30 MPa in one or more embodiments of the wafer carrier.

An assembly in accordance with a further exemplary embodiment includes a wafer carrier having a rectangular configuration, a top surface, a bottom surface, and a recess having a circular configuration, the recess having a bottom surface between and parallel to the top and bottom surfaces of the wafer carrier and being bounded by an annular wall extending between the top surface of the wafer carrier and the bottom surface of the recess. FIG. 5B shows one such exemplary wafer carrier 92. Another wafer carrier 108 is shown in FIG. 6B. The assembly further includes a round wafer structure positioned within the recess, the wafer structure having a peripheral edge and comprising a wafer and a patterned photoresist layer on the wafer. FIGS. 5DD and 6DD show a wafer structure so positioned, the wafer structure including a wafer 50 and a patterned photoresist layer 96. An adhesive seal is between the peripheral edge of the wafer structure and the annular wall, the adhesive seal having a top surface coplanar with a top surface of the photoresist layer and the top surface of the wafer carrier. FIGS. 5EE and 6EE show such an adhesive seal 94. In a further embodiment of the assembly, a spacer is between the bottom surface of the recess and a bottom surface of the wafer structure and contacts both. Such a spacer 106 is shown in FIGS. 6DD and 6EE. The adhesive seal further extends between the bottom surface of the wafer structure and the bottom surface of the recess in some exemplary embodiments of the assembly, such as that shown in FIG. 6EE. One or more embodiments of the assembly further include a fill head configured for depositing molten solder adjoining the wafer carrier. FIGS. 5F and 6F show a fill head 34 for depositing molten solder.

An apparatus is provided in accordance with a further exemplary embodiment as described above with reference to FIGS. 7C and 7D. The apparatus includes an assembly including a plate 120 and a fixture 122, the fixture comprising a base 124, a first opening extending through the base, and a surface layer 126 on the base and extending over the opening in the base, the surface layer having a low friction top surface and including a second, circular opening 130 aligned with the first opening 128, the plate and fixture being in opposing relation, and an injection head 34 configured for injecting molten solder, the injection head including a slot 34A having a length at least equal to the diameter of the second opening. The surface layer is comprised of a flexible material in one or more embodiments of the apparatus, for example Kapton. The first opening 128 is circular and the first and second openings are concentric in one or more embodiments. The plate is a vacuum plate in one or more exemplary embodiments. The injection head contains molten solder in accordance with further embodiments of the apparatus. In one or more embodiments, the base contacts the plate and the injection head contacts the surface layer of the fixture such as shown in FIG. 7D.

Principles of the present disclosure further provide methods for forming solder bumps on the wafers. In one aspect, an exemplary method includes providing a round wafer 50 having a circular peripheral edge and a plurality of electrically conductive contact pads such as contact pads 22 as shown in FIG. 1A, depositing a photoresist layer 96 on the wafer, patterning the photoresist layer such that a plurality of channels are formed over the contact pads, each of the channels having substantially the same height, and depositing a layer of metal over the contact pads. (See, for example, FIGS. 1C-E, which illustrate such photoresist depositing, patterning, and metal deposition and FIGS. 3B-C which illustrate such steps in less detail.) The method further includes providing a carrier including a recess having a circular configuration. An exemplary carrier 60 having a recess 62 is shown in FIG. 3D. Subsequent to depositing and patterning the photoresist layer and depositing the layer of metal over the contact pads, the round wafer is positioned in the recess of the carrier such that a top surface of the carrier is coplanar with a top surface of the photoresist layer. A fill head 34 containing molten solder is passed over the channels while the wafer is in a low oxygen environment and molten solder containing no flux is injected into the channels from the fill head, such as shown in FIG. 3E. The solder is allowed to solidify, whereby the solder adheres to the metal and forms bumps. The photoresist layer is removed from the wafer. In one or more embodiments of the method, the carrier includes an elastomeric body portion defining the recess, and the method further includes causing the elastomeric body portion to engage the peripheral edge of the wafer, thereby forming a compliant seal between the wafer and elastomeric body portion that prevents ingress of the molten solder between the wafer and the carrier. The photoresist layer 96 is deposited by spin coating in one or more embodiments.

In accordance with a further aspect, a method is provided that includes obtaining a carrier 80 comprising a recess having a circular configuration and an elastomeric body portion 82 adjoining the recess, obtaining a round wafer structure 50A including a wafer 50 having a plurality of electrically conductive structures and a photoresist layer 96 on the wafer, the photoresist layer including a plurality of channels aligned with the electrically conductive structures, and placing the wafer structure in the recess such that a top surface of the photoresist layer is coplanar with a top surface of the carrier and the elastomeric body portion of the carrier engages a peripheral edge of the wafer structure, thereby forming a compliant seal between the wafer structure and the elastomeric body portion. The method further includes passing a fill head 34 containing molten, flux-free solder, such as shown in FIG. 4J, over the wafer structure 50A and carrier 80 while injecting the molten, flux-free solder into the channels such that the solder contacts the electrically conductive structures and fills the channels. The method further includes solidifying the solder in the channels, forming solder bumps on the wafer. In one or more exemplary embodiments, the electrically conductive structures comprise copper, nickel, or nickel-iron pillars formed on contact pads.

A further exemplary method that includes obtaining a structure including a plate 70 and a frame 72 mounted to the plate, the frame defining a rectangular enclosure, a round wafer 74 on the plate and within the enclosure, a ring 76 positioned on the wafer, the ring and wafer being concentric, and a carrier body 82 comprising an elastomeric polymer material and having a rectangular configuration within the enclosure and between and contacting the frame and the ring. The method further includes detaching an assembly comprising the elastomeric polymer material, the ring and the wafer such as shown in FIG. 4F from the structure and forming a round recess 86 within the elastomeric polymer material by detaching the wafer 74 from the elastomeric polymer material.

A method in accordance with a further aspect of the disclosure comprises obtaining a round wafer structure 50A including a wafer 50 having a plurality of electrically conductive structures and a photoresist layer 96 on a top surface of the wafer, the photoresist layer including a plurality of channels aligned with the electrically conductive structures. The method further includes obtaining an assembly including a plate 120 and a fixture 122, the fixture comprising a base 124, a first opening 128 extending through the base, and an annular layer 126A extending over the opening in the base, the annular layer including a second opening 130 aligned with the first opening, the plate and fixture being in opposing relation. The round wafer structure is placed on the plate. The base of the fixture is caused to adjoin the plate such that the round wafer structure is positioned within the first opening and the annular layer adjoins the top surface of the wafer. An injection head traverses the wafer structure and injects molten solder within the channels, such as shown in FIG. 7D. In one or more exemplary embodiments of the method, the step of obtaining the round wafer structure further includes spin coating the photoresist layer on the wafer and patterning the spin coated photoresist layer to form the channels. In one or more further exemplary embodiments, the method further includes the step of exerting a vacuum force on the round wafer structure to maintain its position on the plate 120.

The methods described above can be used in the fabrication and packaging of integrated circuit chips, particularly flip chips; in particular, techniques set forth herein can be used to make arrays of solder bumps for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

Aspects of exemplary embodiments are described herein with reference to flowchart illustrations of methods and apparatus (systems). It will be understood that each block of the flowchart illustrations, and combinations of blocks in the flowchart illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be noted that any of the methods described herein can include an additional step of providing a system comprising distinct software modules embodied on a computer readable storage medium; the modules can include, for example, an initialization module, a module to cycle through test points and parameters, an output module to generate an output file, a post-processing module to reduce the data and search for anomalies, and the like. The method steps, such as those described with respect to FIGS. 1A-J, 4A-L, 5A-G and 6A-G can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
obtaining a carrier comprising a recess having a circular configuration and an elastomeric body portion adjoining the recess;
obtaining a round wafer structure including a wafer having a seed layer, a photoresist layer comprising a plurality of channels and a plurality of electrically conductive structures aligned in the plurality of channels and positioned on the seed layer;
placing the wafer structure in the recess such that a top surface of the photoresist layer is coplanar with a top surface of the carrier and the elastomeric body portion of the carrier engages a peripheral edge of the wafer structure, thereby forming a compliant seal between the wafer structure and the elastomeric body portion;
passing a fill head containing molten, flux-free solder over the wafer structure and carrier while injecting the molten, flux-free solder into the channels such that the solder contacts the electrically conductive structures and fills the channels;
solidifying the solder in the channels, forming solder bumps on the wafer; and
removing the photoresist layer and selected portions of the seed layer underneath the photoresist layer from the wafer structure to form a wafer product.

2. The method of claim 1, wherein the step of obtaining a round wafer structure further includes spin coating the wafer with a photoresist material to form the photoresist layer and patterning the photoresist layer to form the channels.

3. The method of claim 2, wherein the electrically conductive structures comprise copper, nickel, or nickel-iron pillars formed over contact pads.

4. The method of claim 2, wherein the carrier is rectangular.

5. The method of claim 2, wherein the carrier includes a rigid ring extending through the elastomeric body portion of the carrier and communicating with the recess, further including exerting a force on the wafer through the ring, thereby detaching the wafer from the carrier.

6. The method of claim 1, wherein the carrier includes a concave peripheral wall adjoining the recess and the peripheral edge of the wafer is convex, further including positioning the convex peripheral edge of the wafer within the concave peripheral wall.

7. The method of claim 6, further comprising applying a polymer film on a top surface of the elastomeric body portion.

8. The method of claim 7, wherein the polymer film is a polyimide film.

9. The method of claim 8, wherein the carrier includes a rigid ring extending through the elastomeric body portion of the carrier and communicating with the recess.

10. The method of claim 9, wherein the ring is comprised of copper and has a cylindrical wall.

11. The method of claim 10, wherein the cylindrical wall is concentric with the wafer.

12. The method of claim 11, wherein the elastomeric body is comprised of a material having a modulus of elasticity in a range of three to thirty MPa.

13. The method of claim 12, wherein the elastomeric body is configured for at least 30% elongation.

14. The method of claim 13, wherein the material of the elastomeric body has a viscosity in a range of 50,000 cps through 500,000 cps.

15. The method of claim 14, further comprising detaching the wafer structure from the carrier.

16. The method of claim 15, wherein detaching the wafer structure comprises pushing the wafer structure out of the carrier by a tool that enters the ring and engages a bottom surface of the wafer.

17. The method of claim 16, further comprising securing the wafer structure to the carrier by an adhesive.

18. The method of claim 17, wherein the seed layer is comprised of TiCu.

19. The method of claim 18, wherein the seed layer has a thickness in a range of 25 μm through 100 μm.

* * * * *